(12) United States Patent
Shields

(10) Patent No.: US 6,412,498 B1
(45) Date of Patent: *Jul. 2, 2002

(54) LOW TEMPERATURE PLASMA STRIP PROCESS

(75) Inventor: Jeffrey A. Shields, Sunnyvale, CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/533,999

(22) Filed: Mar. 24, 2000

(51) Int. Cl.$^7$ .................. H01L 21/302; B08B 6/00
(52) U.S. Cl. .................. 134/1.2; 134/1.3; 438/715; 438/725; 216/49; 216/67
(58) Field of Search .................. 134/1.2, 1.3; 216/49, 216/67; 438/715, 725

(56) References Cited

U.S. PATENT DOCUMENTS

| | | | | |
|---|---|---|---|---|
| 4,624,728 A | * | 11/1986 | Bithell et al. | 156/345 |
| 4,689,112 A | * | 8/1987 | Bersin | 156/643 |
| 5,226,056 A | * | 7/1993 | Kikuchi et al. | 156/345 |
| 5,228,052 A | * | 7/1993 | Kikuchi et al. | 156/345 |
| 5,681,780 A | * | 10/1997 | Mihara et al. | 156/659.1 |
| 5,811,358 A | * | 9/1998 | Tseng et al. | 438/725 |
| 5,882,489 A | * | 3/1999 | Bersin et al. | 216/18 |
| 5,939,241 A | * | 8/1999 | Leu et al. | 430/18 |
| 6,044,850 A | * | 4/2000 | Ozawa et al. | 134/1.1 |
| 6,251,794 B1 | * | 6/2001 | Peng et al. | 438/712 |

FOREIGN PATENT DOCUMENTS

| | | | |
|---|---|---|---|
| JP | 01-179327 | * | 7/1989 |
| JP | 06-124926 | * | 5/1994 |
| JP | 08-288260 | * | 11/1996 |
| JP | 09-027474 | * | 1/1997 |
| JP | 10-135186 | * | 5/1998 |
| JP | 10-209133 | * | 8/1998 |

* cited by examiner

*Primary Examiner*—George Goudreau

(57) ABSTRACT

A method for plasma stripping a defective resist from a wafer that significantly reduces formation of residue between metal lines caused by conventional plasma stripping methodology and eliminates bridging, short-circuiting, and device failure caused thereby. The method includes locating a wafer in a chamber having a platen, reducing a pressure in the chamber to a predetermined pressure, and placing the wafer in contact with the platen to heat the wafer. In the method, the wafer is heated to a temperature below approximately 210° C. and is then moved away from the platen while the wafer temperature is below approximately 210° C. Plasma stripping a resist layer is then performed while maintaining the wafer temperature below approximately 210° C. By maintaining the temperature of the wafer below approximately 210° C., residue formation is substantially prevented and product yield is improved.

22 Claims, 4 Drawing Sheets

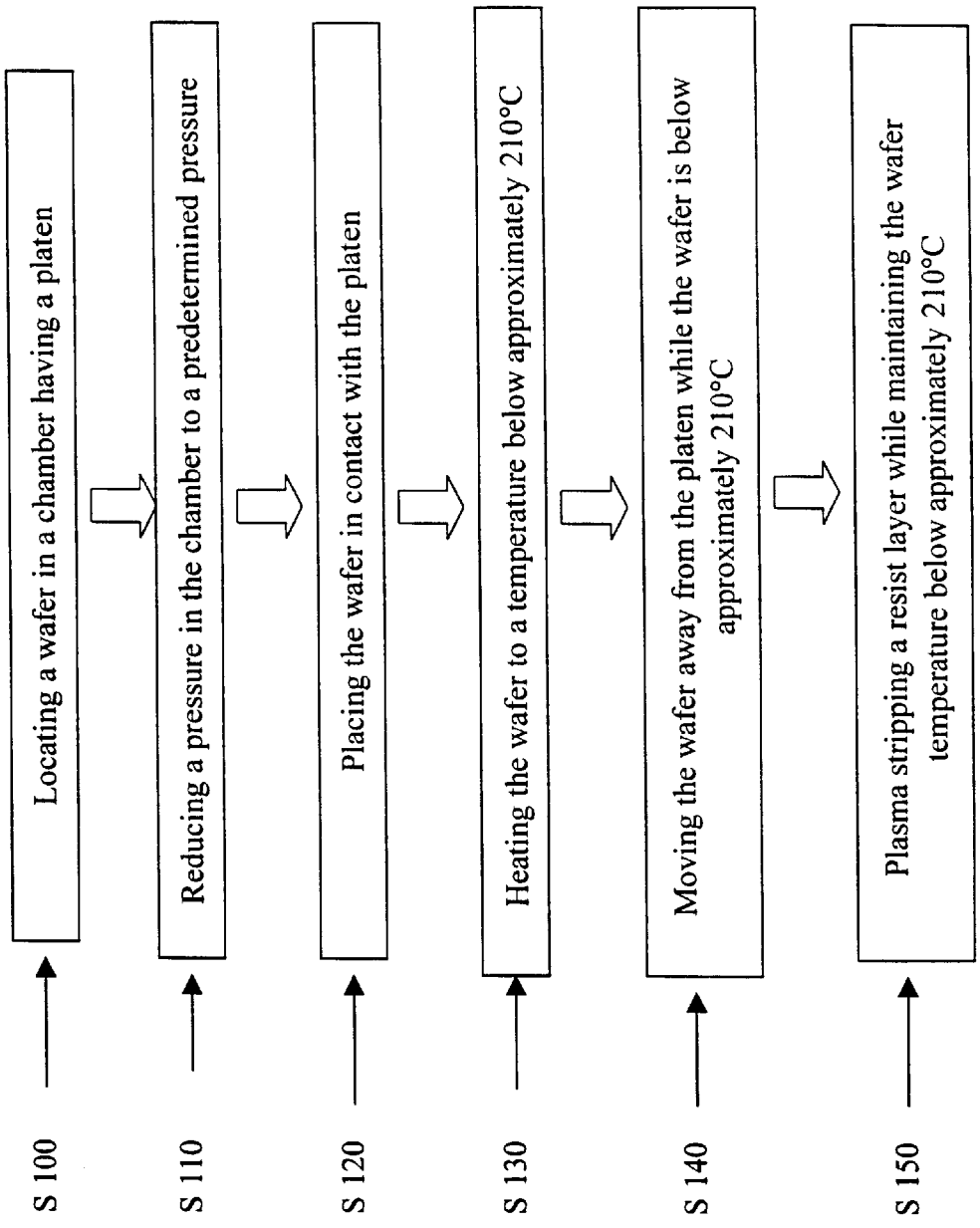

LOW TEMPERATURE PLASMA STRIP PROCESS

FIELD OF THE INVENTION

The present invention relates to the field of manufacturing semiconductor devices with patterned metal interconnections, and more particularly, to manufacturing high density semiconductor devices with submicron patterned metal features for local and global interconnections.

BACKGROUND OF THE INVENTION

Current demands for high density and performance associated with ultra large scale integration require submicron features of about 0.25 microns and under, increased transistor and circuit speeds and improved reliability. Such demands for increased density, performance and reliability require device features with high precision and uniformity.

Conventional semiconductor devices comprise a substrate and various electrically isolated regions, called active regions, in which individual circuit components, such as transistors comprising gates and source/drain regions, are formed and interconnected. In one interconnection scheme, shown in FIGS. 1(a) and 1(b), source/drain regions 3 and gates 4 of neighboring transistors are connected to one another by local interconnections 5 to form "standard cells" which, in turn, are connected to each other locally and globally by several patterned metal layers (e.g. 8) interleaved with insulating layers (e.g. 7) formed above and extending substantially horizontally with respect to the substrate 1 surface. The metal layers (e.g. 8) are connected to one another and to the local interconnection 5 by vias (e.g., contacts 6).

Conventional practices employ aluminum alloys for interconnects, with various metals, such as copper, added for electromigration improvement. One conventional interconnect scheme, shown in FIG. 1(a), comprises depositing a composite three-layer metal stack 8 comprising an upper layer 8c of titanium nitride (TiN) or titanium-titanium nitride (Ti—TiN), an intermediate layer 8b of aluminum (Al) or Al alloy and a lower layer 8a of titanium (Ti) or Ti—TiN, as by sputtering.

A patterned photoresist mask 9 is then formed on the metal layer 8 defining a metal pattern and the underlying metal is etched through the mask 9 to form the pattern of metal lines 8. The quality of the photoresist mask 9 is crucial to the definition of the metal interconnect layer and, ultimately, to device performance. Thus, if defects are observed or detected in the mask, it must be removed and replaced (i.e., reworked) with a defect free mask before etching. A successful resist mask rework completely removes all of the resist 9 without damaging the underlying substrate material, increasing the defect density, or introducing systematic yield variations.

Conventional photoresist mask removal techniques include pumping down the pressure in a plasma chamber after the wafer has been placed on a heated platen and stripping the wafer, such as by oxygen plasma stripping, while the wafer temperature is substantially at the platen temperature of 240° C. to 260° C. The stripping process is typically followed by solvent cleaning. A new patterned photoresist mask is then formed on the underlying metal layer and etching is conducted to form the patterned metal lines. However, wafers processed by these conventional techniques exhibit an abnormally high defect density after the subsequent metal etch process, due to formation of a residue (R). This residue (R), illustrated in FIG. 1(b), causes bridging between adjacent lines and, hence, short-circuiting and device failure.

Investigation by the inventors revealed that residue (R) was formed as a result of precipitates from an alloy solution, influenced by the temperature and duration of the rework. In one exemplary configuration, copper (Cu) precipitated out of an Aluminum-Copper (Al/1%Cu) alloy, leading to residue formation and bridging, and the residue (R) increased as the concentration of the copper in the AlCu alloy was increased. Moreover, the residue (R) was found to increase and decrease with increases and decreases in the temperature and duration of the rework.

Generally, a method is needed to permit efficient limitation of wafer temperature during processing to prevent formation of the aforementioned precipitates. More specifically, there is a need for a method enabling replacement of a defective resist mask without the aforementioned bridging yield losses and without collaterally compromising throughput or yield. These needs are particularly acute in manufacturing high density devices having minimal inter-wiring spaces.

SUMMARY OF THE INVENTION

The inventors determined that the wafer temperature should be decreased below approximately 210° C. to prevent residue formation, contrary to conventional plasma strip operations which seek to raise the wafer temperature as high as possible to increase the strip rate. The inventors also determined that the rate of heat transfer between the platen and the wafer corresponded to increases and decreases of the chamber pressure when the wafer contacted the platen.

One approach to limiting wafer temperature is to lower the platen temperature in the plasma strip chamber. However, this temperature change is time consuming, lowering throughput, and potentially can increase the defect levels in the chamber, lowering yield.

According to the invention, the earlier stated needs are met in part by a method for plasma stripping a resist from a wafer, including the steps of locating a wafer in a chamber having a platen and reducing a pressure in the chamber to a predetermined pressure. The wafer is placed in contact with the platen and heated to a temperature below approximately 210° C. While the temperature is below approximately 210° C., the wafer is moved away from the platen and plasma stripping is performed on a resist layer with the temperature of the wafer being maintained below approximately 210° C.

Another aspect of the invention includes a method for manufacturing a semiconductor device, including the steps of placing a wafer in a chamber having a platen and conducting a fast heating by placing the wafer in contact with the platen to heat the wafer to within a first temperature range between approximately 150° C. and 180° C. Then, a slow heating is conducted by raising the wafer away from the platen to heat the wafer to within a second temperature range between approximately 180° C. and 210° C. Plasma stripping of a resist layer is performed while the wafer temperature is maintained within approximately 150° C. and 180° C. The separate fast and slow heating of the wafer results in a more desirable controlled heating of the wafer during resist stripping is achieved.

Maintaining the wafer temperature below approximately 210° C. during the plasma stripping process in accord with the above aspects of the invention, residue (R) formation is prevented, improving product yield.

Additional features and advantages of the present invention will become readily apparent to those skilled in the art from the following detailed description, wherein only preferred embodiments of the invention are shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIG. 2 shows a process diagram of a first embodiment of the present invention.

DESCRIPTION OF THE INVENTION

The invention addresses and solves problems stemming from the replacement of a defective resist mask on a metal layer with a substantially non-defective resist mask. This method involves locating a wafer in a chamber having at least one heating element, such as a heated platen or a UV lamp, reducing a pressure in the chamber to a predetermined pressure, and heating the wafer to a predetermined temperature (e.g., between approximately 150° C. and 210° C.) using the heating element(s). Plasma stripping of a resist layer is performed while maintaining the wafer temperature below approximately 210° C. Specifically, the invention addresses problems associated with removal of a defective resist mask from a metal layer and substantially eliminates formation of residue or precipitate by maintaining the wafer temperature below a prescribed temperature. Thus, "bridging", short-circuiting and device failure caused by the residue is substantially prevented.

Figure 4A:
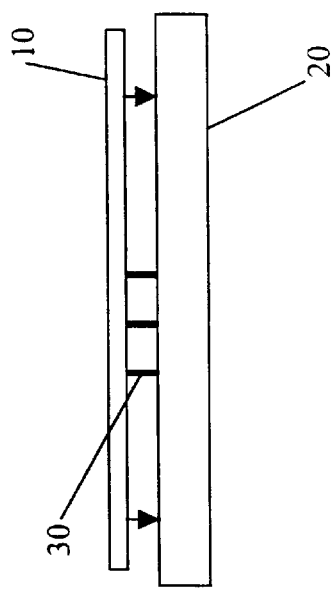
FIGS. 4(a)–(c) show insertion of a wafer into a chamber, lowering of the wafer to the platen, and raising the wafer away from the platen in accord with the first and second embodiments.

FIG. 2 shows a flowchart of one preferred embodiment of a method for plasma stripping a resist from a wafer. In STEP 100 a wafer is placed in a chamber having a platen. For example, the wafer may be placed in the chamber by a transfer arm. With reference to FIG. 4(a), a Gasonics L3500 plasma stripper is particularly suited for the method of the invention, since it allows positional control of a wafer 10 relative to the platen 20 by way of three movable pins 30 disposed near the center of the platen 20 which can be raised or lowered to correspondingly raise the wafer off of the platen or lower the wafer to the platen. Naturally, any other plasma stripper providing positional control of a wafer 10 relative to a platen 30 would be suitable. In STEP 100, for example, the pins 30 could be raised to lift the wafer off of a transfer arm (not shown) to permit retraction of the transfer arm from the wafer.

Figure 4B:
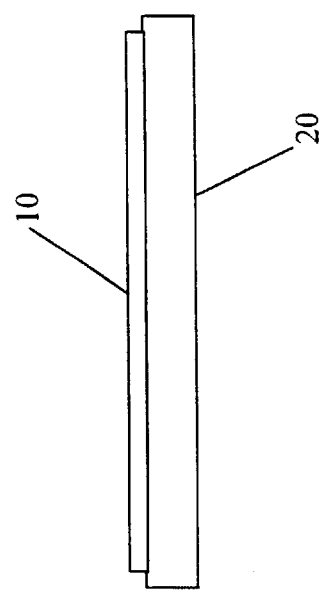
Figure 4C:
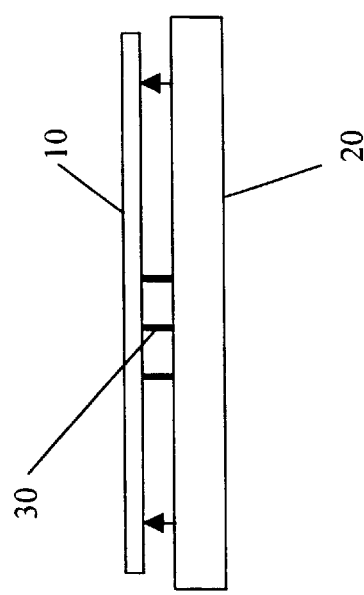

The pressure in the chamber is then reduced to a predetermined pressure (STEP 110) and the wafer is placed in contact with the platen (STEP 120). FIGS. 4(a) and 4(b) illustrate the lowering of the wafer 10 to contact the platen 30, as generally indicated by the direction of the arrows in FIG. 4(a). The wafer 10, in contact with the platen 20, is heated to a temperature below approximately 210° C. (STEP 130). The temperature of the wafer may be measured in a variety of ways. One approach to measuring wafer temperature is indirect, using an instrumented wafer with at least one embedded thermocouple to measure wafer temperatures for selected process parameters to establish baseline wafer temperature/time measurements. In this manner, a correlation can be made between the selected parameters, wafer temperature, and time enabling establishment of appropriate process controls to ensure that the wafer temperature is maintained within allowable temperature ranges. Another approach is simply to use a plasma stripping apparatus having integrated contact thermocouples. Still another approach is to use optical temperature measurements, such as by an IR gun or other non-contact optical measurement systems, for chambers allowing sufficient optical access during processing.

While the wafer 10 temperature is below approximately 210° C., the wafer 10 is moved away from the platen 20 (STEP 140). In STEP 150, plasma stripping of a resist layer is performed while maintaining the wafer temperature below approximately 210° C. In other words, plasma stripping may be performed at any time the wafer temperature is below approximately 210° C., whether or not the wafer is in contact with the platen 20 or has been placed in contact with the platen 20. It suffices that the wafer temperature is maintained below approximately 210° C. to thereby substantially eliminate the aforementioned problems associated with residue formation and bridging. To maximize throughput, however, it is preferred to heat the wafer quickly to thereby enhance the plasma stripping effectiveness.

In this embodiment, it is preferred that STEP 110, reducing a pressure in the chamber to a predetermined pressure, includes reducing the pressure to a predetermined pressure between 1000 mT and 2000 mT, whereupon the wafer is placed in contact with the platen (STEP 120) and heated to a temperature below approximately 210° C. (STEP 130). Alternately, this predetermined pressure may be below approximately 1000 mT or below approximately 100 mT. Thus, in this embodiment the wafer is not placed on the platen until after the desired, or predetermined, pressure has been reached. This reduction in chamber pressure prior to placing the wafer in contact with the platen reduces the rate of heat transfer to the wafer, slows the resultant temperature increase of the wafer, and enables greater control of the process than that afforded by conventional methods. Therefore, depending on the desired rate of heat transfer and process control restraints, the predetermined pressure may be adjusted accordingly, although it is generally preferred to reduce the pressure to below at least 2000 mT.

Further, according to this embodiment of the invention, it is preferred that the wafer is heated by at least one heating element, such as a heated platen or UV lamp, to a temperature only between approximately 150° C. and 180° C. in STEP 130 prior to moving the wafer away from the platen (STEP 140), wherein the temperature may be measured or determined as indicated above. This temperature range is particularly advantageous since the wafer temperature will continue to increase even when the wafer is not in contact with the platen due to heat transfer to the wafer from the platen and the plasma strip. When standard resist strip process parameters are used in conjunction with the method of the present invention, the wafer temperature increases slowly, approximately 5–20° C. per minute, when the wafer is not in contact with the platen. In this way, the wafer will be heated to a temperature between approximately 180° C. and 210° C. during the plasma strip process, but will not exceed approximately 210° C. during plasma stripping. Thus, this preferred temperature range takes into account wafer temperature increases under standard resist strip parameters, such as a plasma strip process temperature between 240° C. and 260° C., and permits a desired reduction in residue formation without imposing additional restrictions on the resist strip process parameters and without unduly impacting the manufacturing process.

In accord with this embodiment, a resist is formed on a metal layer or a composite structure comprising a layer of an aluminum alloy. This method finds particular applicability to aluminum alloys comprising about 1% copper used, for example, in interconnects. One example of such an interconnect is a three-layer metal stack including a top layer of TiN, an intermediate layer of an Al alloy containing about 1% Cu, and a bottom layer of Ti, which, in turn, is typically formed on a dielectric layer. Upon observing or detecting that the resist is defective, it is substantially entirely removed prior to metal patterning by exposing the resist to, for example, an oxygen plasma strip process. Thus, according to the method of the present invention, formation of residue R is substantially reduced or prevented by stripping the resist at a relatively low temperature, which also simplifies resist removal. Thus, this method advantageously provides an efficient, cost-effective way to replace a defective resist, particularly from a metal layer, while avoiding, for example, copper precipitation from the Al alloy, which leads to bridging in the patterned metal layer and short-circuiting.

Figure 1A:
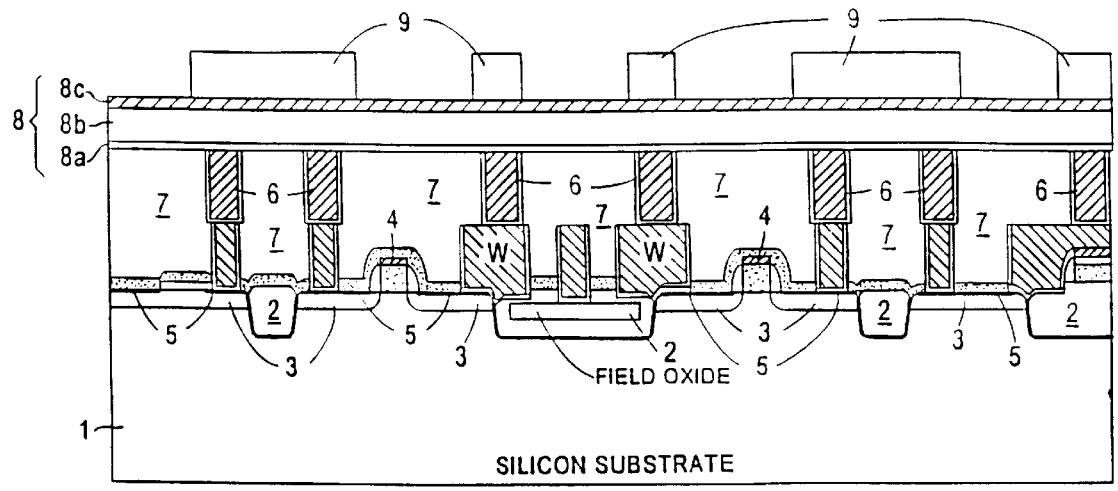
FIGS. 1(a)–(b) show the results of a conventional photoresist mask removal technique wherein a residue R is formed following etching.
Figure 1B:
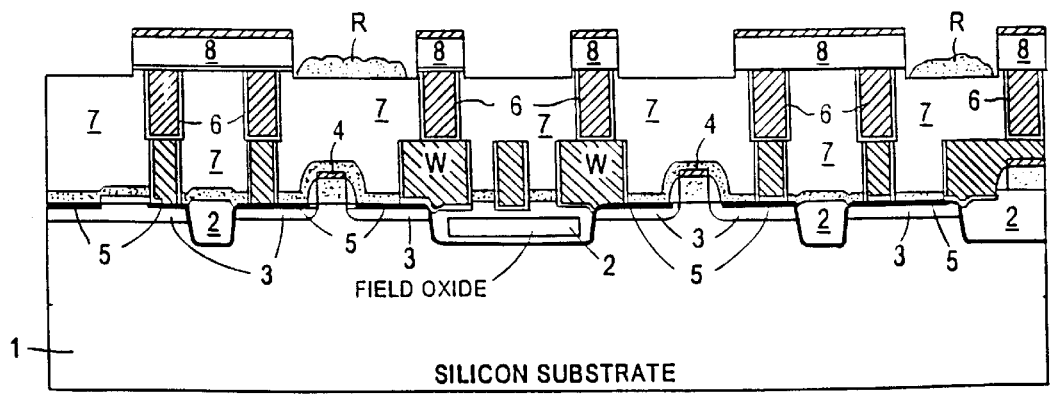
Figure 3:
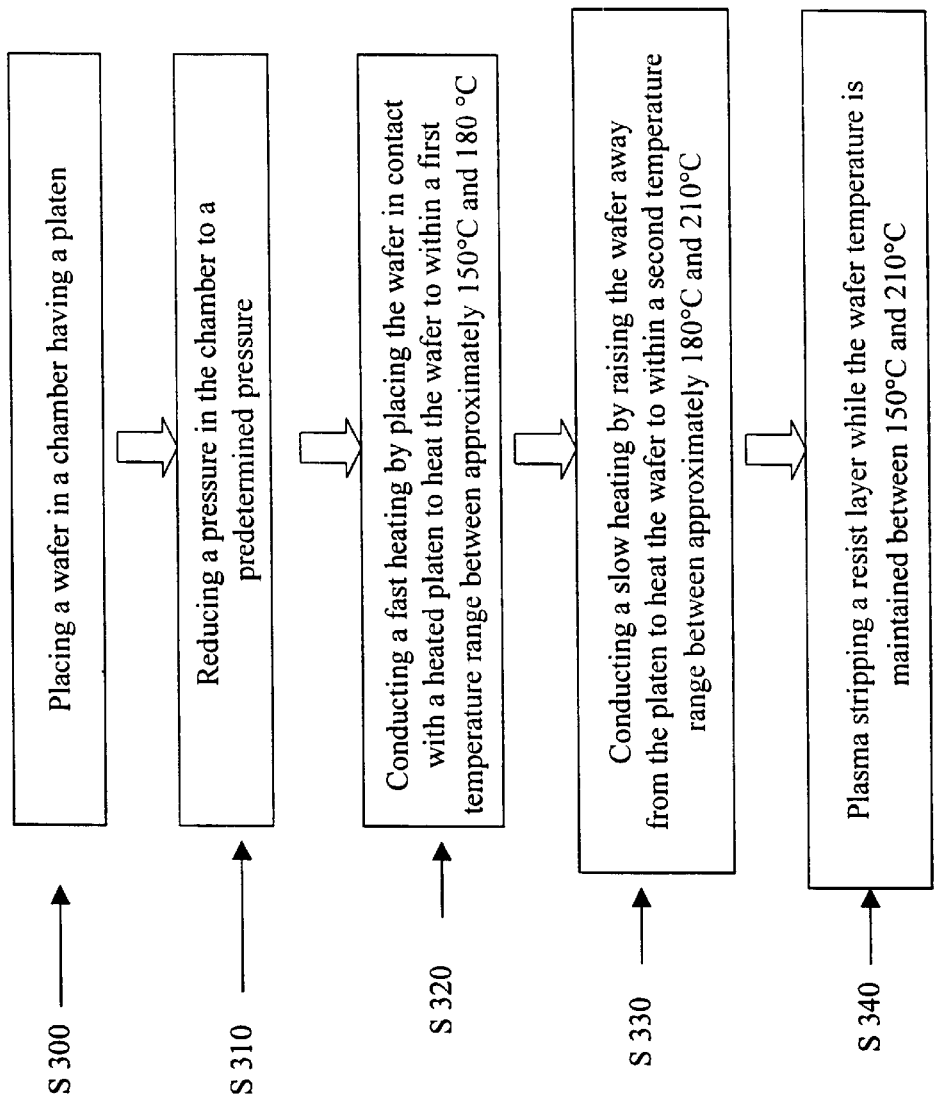
FIG. 3 shows a process diagram of a second embodiment of the invention.

FIG. 3 shows a second embodiment of the invention, outlining a method for manufacturing a semiconductor device. After a wafer is placed in a chamber having a platen (STEP 300), a fast heating is conducted by placing the wafer in contact with the platen to heat the wafer to within a first temperature range between approximately 150° C. and 180° C. (STEP 320), wherein the temperature is measured or determined as indicated above. As illustrated in FIG. 3, it is preferred that a pressure in the chamber is reduced to a predetermined pressure (STEP 310) prior to the fast heating step (STEP 320). Although it is not necessary to reduce the pressure to a predetermined pressure (STEP 310) prior to the fast heating step (STEP 320), the wafer heats very quickly when the wafer is in contact with the platen at atmospheric pressures, taking only a few seconds to approximate the platen temperature and it is preferred to reduce the pressure to slow the rate of heating and simplify process control. The predetermined pressure is preferably between 1000 mT and 2000 mT to achieve a wafer temperature of between approximately 150° C. and 180° C. within a desired time period of 15–20 seconds, although a higher pressure may be selected to heat the wafer more quickly and, conversely, a lower pressure (e.g., below 1000 mT) may be selected to heat the wafer more slowly.

As shown in FIG. 3, subsequent to the fast heating (STEP 320), a slow heating is conducted by raising the wafer away from the heated platen to heat the wafer to within a second temperature range between approximately 180° C. and 210° C. (STEP 330). In cases where standard resist strip process parameters are used, such as a plasma strip temperature between 240° C. to 260° C., the wafer temperature increases between about 5–20° C. per minute, depending on the specific control variables selected including but not limited to pressure, gas flow, and lamp power. In STEP 340, plasma stripping of a resist layer is performed while the wafer temperature is maintained within at least one of the first temperature range and the second temperature range. In other words, the wafer temperature is maintained between approximately 150° C. and 210° C. during plasma stripping to prevent residue formation. To maximize throughput, it is preferred to heat the wafer quickly to thereby enhance the plasma stripping effectiveness. Early initiation of the plasma strip process, before the wafer has been placed in contact with the platen and/or before the wafer has been heated to the desired temperature range of at least approximately 150° C., also improves throughput.

In accord with this embodiment, the resist may be formed on a metal layer or a composite structure comprising a layer of an aluminum alloy (e.g., Al/1%Cu). This composite structure is commonly used for interconnects, such as a three-layer metal stack including a top layer of TiN, an intermediate layer of an Al alloy containing about 1% Cu, and a bottom layer of Ti, which, in turn, is typically formed on a dielectric layer. Upon observing or detecting that the resist is defective, it is substantially entirely removed by exposing the resist to, for example, an oxygen plasma strip process. Copper precipitation from the Al alloy is prevented by limiting the temperature of the wafer during the plasma strip process to a temperature below 210° C.

Thus, the method for manufacturing a semiconductor device according to the present invention is characterized by the substantial absence of a residue between the metal layers. As a result, the present invention advantageously reduces the amount of bridging in subsequently formed metal lines, thereby avoiding short circuiting and device failure. The invention is applicable to the manufacture of various semiconductor devices having patterned metal interconnections, particularly high density semiconductor devices.

The present invention can be practiced by employing conventional materials, methodology and equipment. In the previous descriptions, numerous specific details are set forth to provide a thorough understanding of the present invention, although explicit details of such materials, equipment and methodology are not set forth herein in detail so as not to unnecessarily obscure the present invention. However, it should be recognized that the present invention can be practiced without resorting to the details specifically set forth. Only the preferred embodiment of the present invention and but a few examples of its versatility are shown and described in the present disclosure and it is to be understood that the present invention is capable of use in other combinations and environments and contemplates modifications within the scope of the inventive concept expressed herein.

What is claimed is:

1. A method for plasma stripping a resist from a wafer, comprising the steps of:

locating a wafer in a chamber having a platen;

reducing a pressure in the chamber;

placing the wafer in contact with the platen;

heating the wafer to a temperature below approximately 210° C.;

plasma stripping a portion of a resist layer on a top surface of the wafer while the wafer is in contact with the platen and the wafer temperature is below approximately 210° C.;

moving the wafer away from the platen while the wafer temperature is below approximately 210° C.; and plasma stripping another portion of said resist layer on the same top surface of the wafer subsequent to said moving step while maintaining the wafer temperature below approximately 210° C.

2. A method for plasma stripping a resist from a wafer according to claim 1, wherein said pressure is between approximately 1000 mtorr and 2000 mtorr.

3. A method for plasma stripping a resist from a wafer according to claim 1, wherein said pressure is below approximately 100 mtorr.

4. A method for plasma stripping a resist from a wafer according to claim 1, wherein said pressure is below approximately 100 mtorr.

5. A method for plasma stripping a resist from a wafer according to claim 1, wherein the step of heating the wafer includes heating the wafer to a temperature between approximately 150° C. and 180° C.

6. A method for plasma stripping a resist from a wafer according to claim 1, wherein the step of heating the wafer includes heating the wafer to a temperature between approximately 180° C. and 210° C.

7. A method for plasma stripping a resist from a wafer according to claim 1, wherein the resist layer overlies a metal layer.

8. A method for plasma stripping a resist from a wafer according to claim 7, wherein the metal layer is a composite structure comprising a layer of an aluminum alloy.

9. A method for plasma stripping a resist from a wafer according to claim 8, wherein the aluminum alloy comprises 1% copper.

10. A method for plasma stripping a resist from a wafer according to claim 1, wherein the platen is heated to a process temperature between approximately 240° C. and 260° C.

11. A method for manufacturing a semiconductor device, comprising the steps of:

placing a wafer in a chamber having a platen;

reducing a pressure in the chamber;

conducting a fast heating of the wafer by placing the wafer in contact with the platen to heat the wafer to within a first temperature range between approximately 150° C. and 180° C.;

conducting a slow heating of the wafer by raising the wafer away from the platen to heat the wafer to within a second temperature range higher than the first temperature range and below approximately 210° C.; and plasma stripping a resist layer while the wafer temperature is maintained within at least one of said first temperature range and said second temperature range.

12. A method according to claim 11, wherein said reducing step comprises reducing a pressure in the chamber prior to said conducting a fast heating.

13. A method according to claim 12, wherein said pressure is between about 1000 mtorr to 2000 mtorr.

14. A method according to claim 12, wherein said pressure is below about 1000 mtorr.

15. A method according to claim 12, wherein said pressure is below about 100 mtorr.

16. A method according to claim 12, wherein said conducting a fast heating step comprises heating the wafer at a rate between about 5° C. and 10° C. per second.

17. A method according to claim 16, wherein said conducting a slow heating step comprises heating the wafer at a rate of between about 5° C. and 20° C. per minute.

18. A method according to claim 11, wherein the wafer is in contact with the platen for approximately 15–20 seconds during the fast heating of the wafer.

19. A method according to claim 11, wherein the platen is heated to a process temperature between approximately 240° C. and 260° C.

20. A method according to claim 11, wherein the resist layer overlies a metal layer.

21. A method according to claim 20, wherein the metal layer is a composite structure comprising a layer of an aluminum alloy.

22. A method according to claim 20, wherein the aluminum alloy comprises 1% copper.

* * * * *